(12) United States Patent
Kawamura

(10) Patent No.: US 6,266,271 B1
(45) Date of Patent: Jul. 24, 2001

(54) NONVOLATILE SEMICONDUCTOR MEMORY FOR PREVENTING UNAUTHORIZED COPYING

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/572,318

(22) Filed: May 18, 2000

(30) Foreign Application Priority Data

Jul. 16, 1999 (JP) .................................................. 11-203357

(51) Int. Cl.⁷ ..................................................... G11C 11/34
(52) U.S. Cl. ......................................................... 365/185.04
(58) Field of Search ........................... 365/185.04, 185.01

(56) References Cited

U.S. PATENT DOCUMENTS

| | | | |
|---|---|---|---|
| 4,974,208 | * 11/1990 | Nakamura et al. | 365/228 |
| 5,317,717 | * 5/1994 | Cutler et al. | 711/163 |
| 5,592,641 | * 1/1997 | Fandrich et al. | 711/103 |
| 5,749,088 | * 5/1998 | Brown et al. | 711/115 |

* cited by examiner

Primary Examiner—Hoai V. Ho
(74) Attorney, Agent, or Firm—Arent Fox Kintner Plotkin & Kahn, PLLC

(57) ABSTRACT

The present invention is a nonvolatile semiconductor memory having, in addition to a main storage region for storing ordinary data, a hidden storage region for storing a special code for preventing unauthorized copying, and this hidden storage region is in a read enabled state at the time of a write protected state, and is in a read prohibited state at a time when there is no write protected state. Therefore, a hidden storage region can be read out only after a semiconductor memory vendor stores a special code in a hidden storage region, and sets the hidden storage region to a write protected state. And the method for changing to this write protected state is a secret to everyone other than the vendor. As a result thereof, even if a semiconductor memory, for which a special code is not stored in a hidden storage region, is illegally obtained on the black market, since hidden storage region readout is still prohibited, illegally copied data cannot be used, consequently preventing unauthorized copying.

7 Claims, 7 Drawing Sheets

COMMAND DECODER 22

WRITE PROTECT CIRCUIT 3

COMMAND DECODER 22

NONVOLATILE SEMICONDUCTOR MEMORY FOR PREVENTING UNAUTHORIZED COPYING

BACKGROUND OF THE INVENTION

1. Field of the Invention

The present invention relates to a nonvolatile semiconductor memory, such as flash memory, for preventing the unauthorized reproduction of data stored in a main storage region.

2. Description of the Related Art

Flash memory, which is nonvolatile semiconductor memory, is able to write (program) and erase data electrically, and is widely used because stored data is not lost even when the power is turned OFF. For example, it is becoming popular as a memory card for storing music data distributed for a fee via the Internet. Further, it has also come into widespread use as memory for storing data and programs specific to cellular telephones and other compact information terminals.

To prevent the unauthorized copying of music data, and specified data or programs stored in the above-mentioned flash memory, and to prevent the use of flash memory in illegally obtained data equipment, an unauthorized copying prevention function, and an unauthorized use prevention function are required. These functions are achieved, for example, by providing inside flash memory a hidden storage region for storing special data and a key code, in addition to a main storage region for storing ordinary data. This hidden storage region is a one-time programmable memory, and is a storage region that cannot be used by ordinary users.

FIG. 1 is a diagram for explaining unauthorized copying prevention, and unauthorized copying. In flash memory, there are provided a main storage region 1 for storing ordinary data, and a hidden storage region 2 for storing special data, and furthermore, there is provided a write protect circuit 3, which prohibits the rewriting of stored data inside a hidden storage region 2. In addition thereto, flash memory is equipped with circuits required for writing (programming), erasing, and reading.

Now, let us assume that flash memory A, B is memory obtained legally on the market, and that flash memory X is memory that has been obtained illegally. In the flash memory A, B marketed legally, key codes A, B have been written to the respective hidden storage regions 2, and the respective write protect circuits 3 are in the protect mode, which prohibits rewriting. Now then, for example, when predetermined music data is stored in flash memory A, data A is encrypted in accordance with key code A, and this encrypted data A is stored in the main storage region 1. Then, when music data A is played back, data A is read out, decoded by key code A, and the decoded music data thereof is played.

Conversely, when music data A is illegally copied to flash memory B, key code A-encrypted data A is copied inside the main storage region 1 of flash memory B. Consequently, when an attempt is made to play back this illegally copied music data A, the original music data A cannot be acquired by decoding by key code B inside the hidden storage region 2 of flash memory B, and in the end, cannot be played back.

The same technique can be used to prevent the illegal use of information by unauthorized copying in the case of predetermined data or programs instead of music data.

However, if flash memory X of a state, wherein a key code is not written into the hidden storage region 2 at shipment, is illegally placed on the black market, the above-mentioned unauthorized copying prevention function is lost. That is, by storing in respective regions 1, 2 of an illegally obtained flash memory X both key code A of inside a hidden storage region 2, and data A encrypted inside a main storage region 1 of a flash memory A, in which is stored legally encrypted data A, it is possible to illegally copy and illegally use data A.

Therefore, there is need for a nonvolatile semiconductor memory that is capable of preventing the unauthorized copying of data, and the unauthorized use of data in line therewith, even when same is illegally sold on the black market as-is without being programmed with a with a special code in the hidden storage region 2 as described above.

SUMMARY OF THE INVENTION

Accordingly, an object of the present invention is to provide a nonvolatile semiconductor memory capable of preventing the unauthorized copying of data.

A further object of the present invention is to provide a nonvolatile semiconductor memory capable of preventing the unauthorized copying of data, and the unauthorized use of data in line therewith, even when this nonvolatile semiconductor memory is illegally sold on the black market.

To achieve the above-mentioned objects, one aspect of the present invention is a nonvolatile semiconductor memory having, in addition to a main storage region for storing ordinary data, a hidden storage region for storing a special code for preventing unauthorized copying, and this hidden storage region is in a read enabled state at the time of a write protected state, and is in a read prohibited state at a time when there is no write protected state. Therefore, a hidden storage region can be read out only after a semiconductor memory vendor stores a special code in a hidden storage region, and sets the hidden storage region to a write protected state. And the method for changing to this write protected state is a secret to everyone other than the vendor. As a result thereof, even if a semiconductor memory, for which a special code is not stored in a hidden storage region, is illegally obtained on the black market, since hidden storage region readout is still prohibited, illegally copied data cannot be used, consequently preventing unauthorized copying.

To achieve the above-mentioned objects, another aspect of the present invention is a nonvolatile semiconductor memory constituted such that, in addition to a main storage region for storing ordinary data, it has a hidden storage region for storing a special code for preventing unauthorized copying, and this hidden storage region is constituted to be a read enabled state only after the above-mentioned special code has been stored. Consequently, a hidden storage region becomes capable of being read only after a semiconductor memory vendor stores a special code in the hidden storage region, thus preventing unauthorized copying the same as hereinabove.

The above-mentioned special code is, for example, either an encryption code for encrypting the data of a main storage region, or a code for generating this encryption code. There are also cases in which a special code is a recognition code for matching up the semiconductor memory thereof with information equipment capable of using same. In accordance with using this special code, it is possible to constitute the nonvolatile semiconductor memory such that even if data inside a main storage region is copied to another memory illegally, the copied data thereof cannot be utilized.

To achieve the above-mentioned objects, one aspect of the present invention is a nonvolatile semiconductor memory for electrically writing and reading data, comprising: a main storage region for storing ordinary data; a hidden storage region for storing a special code for preventing unauthorized copying; and a write protect circuit for setting the hidden storage region in a write protected state, wherein the hidden storage region is in a read enabled state at the time of a write protected state, and is in a read prohibited state when not in the write protected state.

A preferred embodiment of the above-mentioned invention further comprises a command decoder for decoding a write and a read command from outside, and for generating a respective internal write signal and internal read signal for the hidden storage region, and the command decoder is prohibited from generating the internal read signal when the write protect circuit is not in the write protected state, and is enabled for generating the internal read signal at the time of the write protected state.

Another aspect of the present invention is a nonvolatile semiconductor memory for electrically writing and reading data, comprising: a main storage region for storing ordinary data, and a hidden storage region for storing a special code for preventing unauthorized copying, wherein the hidden storage region is in a read prohibited state when the special code is not stored, and is in a read enabled state when the special code is stored.

A more preferred embodiment of the above-mentioned invention further comprises a write protect circuit for setting the hidden storage region to a write protected state, and a read protect circuit for setting the hidden storage region to a read protected state, and reading of the hidden storage region is prohibited when the read protect circuit is in the read protected state, and reading of the hidden storage region is enabled when the read protect circuit is not in the read protected state.

DESCRIPTION OF THE PREFERRED EMBODIMENTS

Embodiments of the present invention will be explained hereinbelow by referring to the figures. However, the technical scope of the present invention is not limited to these aspects of the embodiment.

Figure 1:
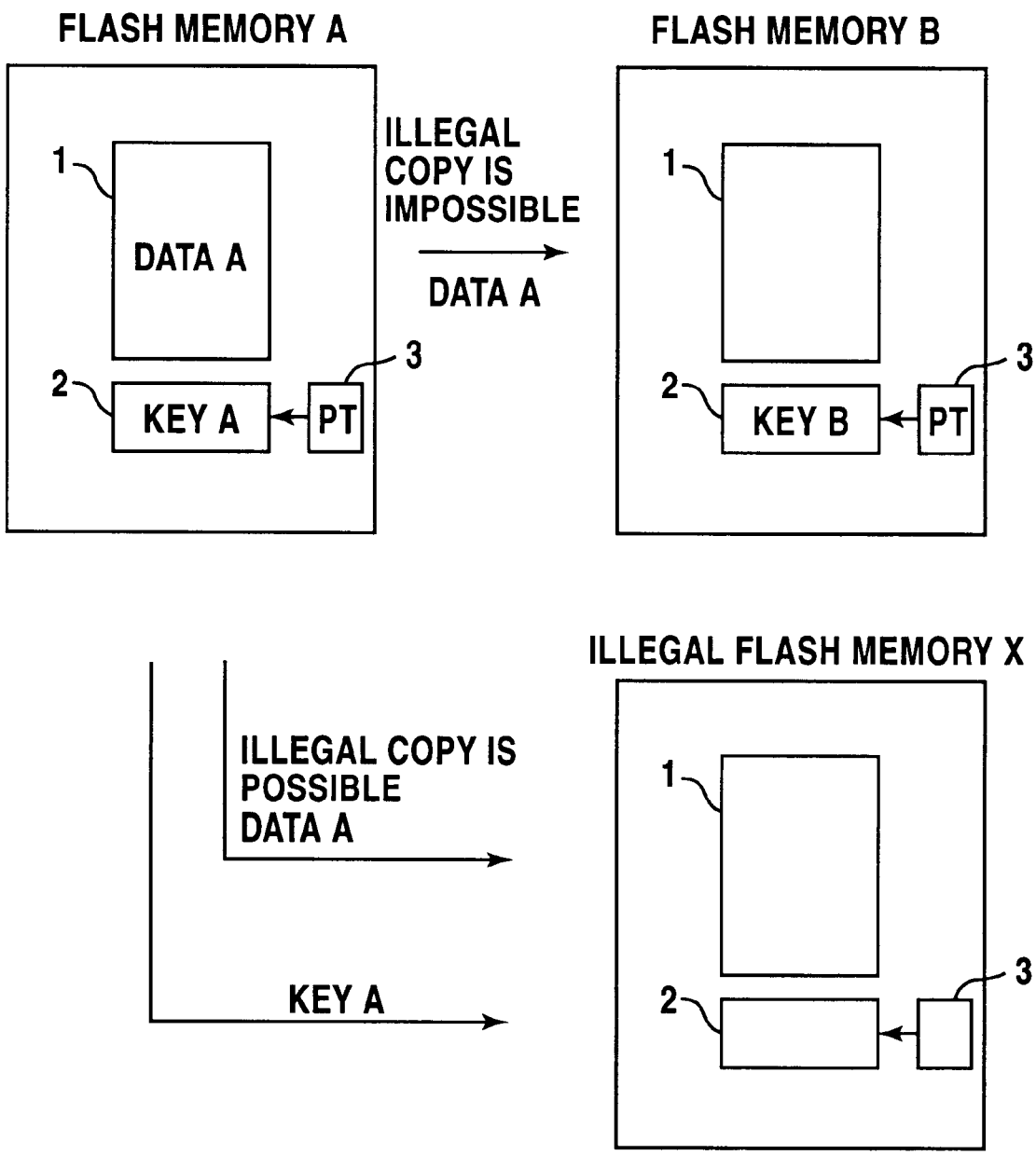
FIG. 1 is a diagram for explaining unauthorized copying prevention and unauthorized copying.

An embodiment of the present invention will be explained in accordance with FIG. 1. In this embodiment, a write protect circuit 3 for protecting a hidden storage region 2 from writing prohibits reading of the hidden storage region 2 when the write protect circuit 3, therefore the hidden storage region 2, is not in a write protected state, and enables reading only when a special code has been written into a hidden storage region 2, setting the write protect circuit 3 in a write protected state. That is, by linking a write protected state of the write protect circuit 3 to a read prohibited state of the hidden storage region 2, a flash memory, for which a special code has not been written into the hidden storage region 2, is constituted such that reading of this hidden storage region 2 cannot be performed. Consequently, even if a flash memory is illegally obtained and data is illegally written in the main storage region 1 and the hidden storage region 2, since reading of the hidden storage region 2 cannot be performed on such illegally obtained flash memory, for which writing to the hidden storage region has not been performed and not been set into write protected state, the utilization of illegally copied data can be prevented.

Figure 2:
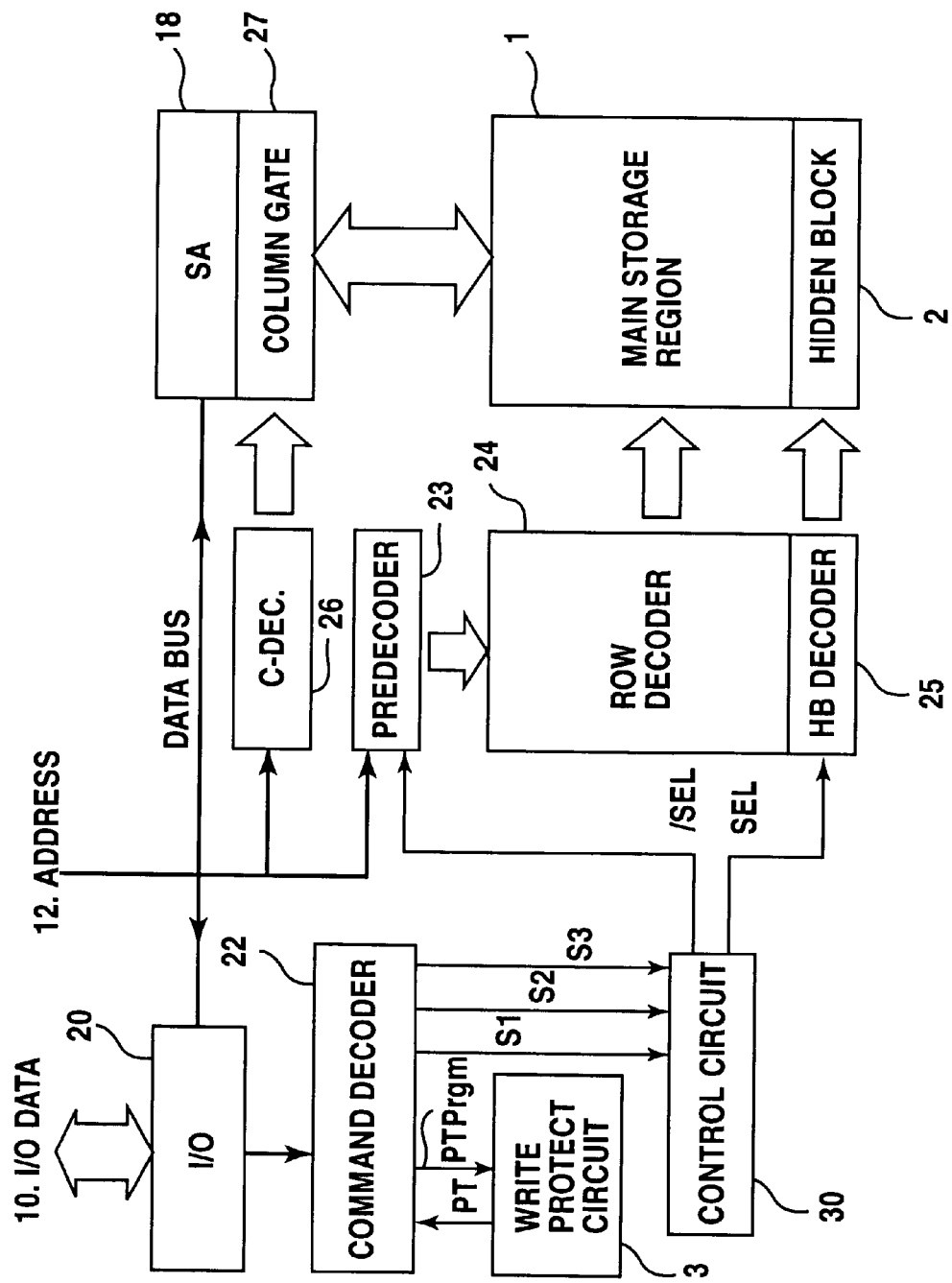
FIG. 2 is a block diagram of a flash memory in a first aspect of the embodiment.

FIG. 2 is a block diagram of a flash memory in a first aspect of the embodiment. The flash memory of FIG. 2 has a main storage region 1 for storing ordinary data, and a hidden storage region (Hidden Block) 2 for storing a special code, and inside these storage regions 1, 2 there are provided a plurality of nonvolatile memory transistors having floating gates.

A word line inside the main storage area 1 is selected by a row decoder 24, and a word line inside the hidden storage region 2 is selected by a corresponding decoder 25. Bit lines provided in both storage regions 1, 2 are connected to a sense amp 18 by way of a column gate 27. The column gate 27 is selected by a column decoder 26. A pre-decode signal is supplied to the row decoder 24 from a pre-decoder 23, to which an address is supplied.

The hidden storage region 2, for example, has the same capacity as the block region inside the main storage region 1, and is selected by a selection signal SEL from a controller 30. Further, the main storage region 1 is selected by a selection signal /SEL from the controller 30.

Input-output data from outside is inputted to an input-output circuit 20, and outputted from the input-output circuit 20. The input-output circuit 20 and sense amp 18 are connected by way of a data bus. In the memory of FIG. 2, there is disposed a command decoder 22 peculiar to a flash memory. A command decoder 22 decodes a specific command supplied to the input-output circuit 20 from an input-output terminal, and generates a variety of internal operation control signals S1, S2, S3, PTPrgm. These internal operation control signals S1, S2, S3 are a portion of the internal operation control signals generated by the command decoder 22, and the internal operation control signals thereof will be explained hereinbelow.

The write protect circuit 3, as explained hereinbelow, has a storage circuit for storing a write protected state, which prohibits writing of the hidden storage region 2, and outputs a write protect signal PT in accordance with the storage state thereof. When this write protect signal PT is in an active state, the generation of an internal write signal S3, and internal erase signal S2 by the command decoder 22 is prohibited, so that rewriting of a special code stored in the hidden storage region 2 is prohibited.

The storage circuit of the write protect circuit 3 is set to the write protected state by a protection programming signal PTPrgm, which the command decoder 22 generates in response to a secret command supplied from outside. Then, once the write protect circuit 3 has been set to a write protected state, the write protect signal PT constitutes an active state, the generation of a protection programming signal PTPrgm by the command decoder 22 is prohibited, and the storage circuit of the write protect circuit 3 cannot be set to a non-protected state once again.

A characteristic feature of the first aspect of the embodiment is that when the write protect circuit 3 is not in the write protected state, generation of an internal read signal S1 by the command decoder 22 for reading the hidden storage region 2 is prohibited, and when the write protect circuit 3 is in a write protected state, generation of this internal read signal S1 is enabled. Consequently, in an initial state of prior to when the writing of a special code is done to the hidden storage region 2, since the write protect circuit 3 does not constitute a write protected state, even if a special code is illegally written to the hidden storage region 2, the reading thereof is prohibited. And, although it is necessary to render the write protect circuit 3 into the write protected state in order to read the hidden storage region 2, the secret command is required for such operation. Consequently, illegally copied data cannot be utilized.

Figure 3:
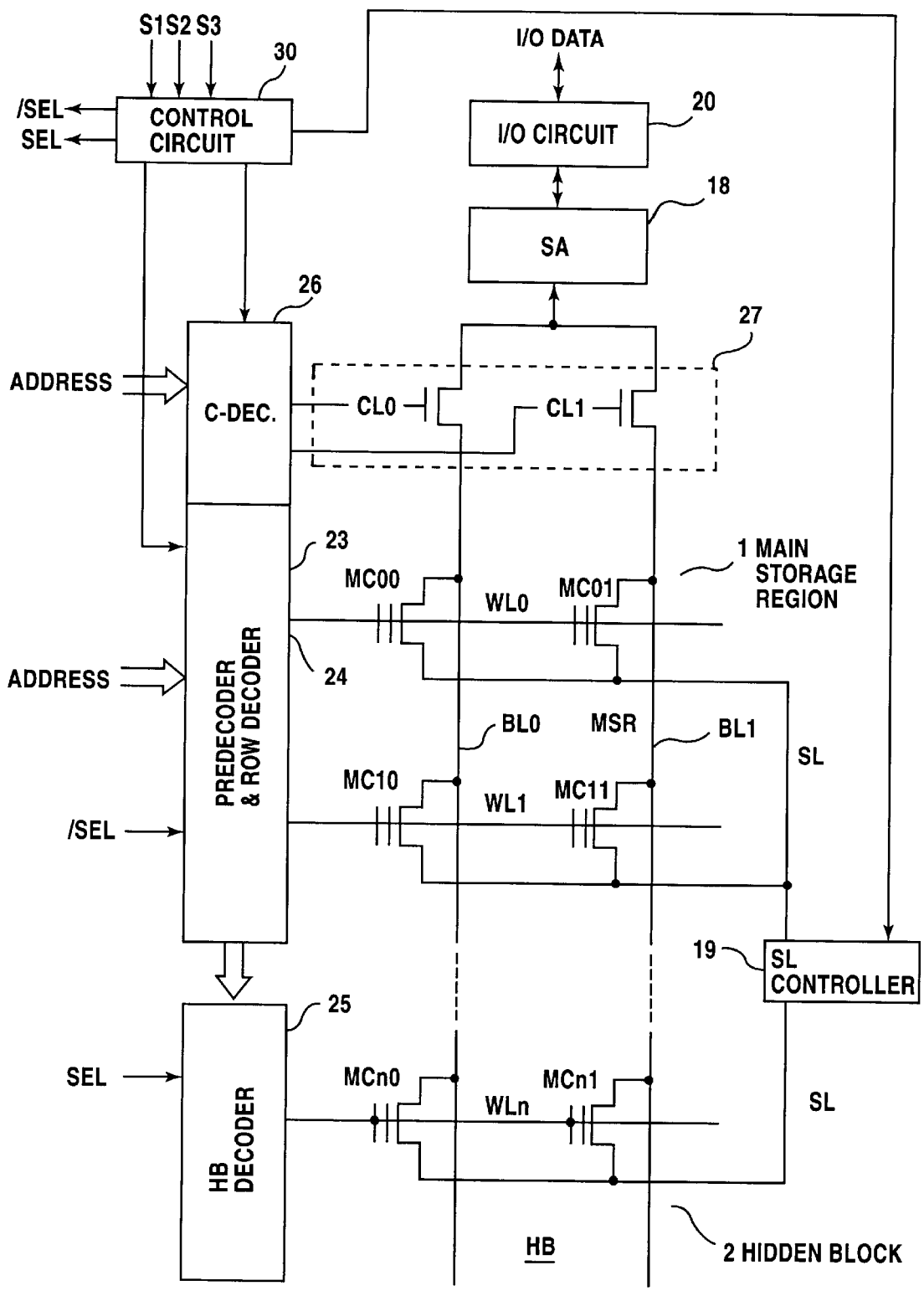
FIG. 3 is a detailed block diagram of a main storage region and a hidden storage region.

FIG. 3 is a detailed block diagram of a main storage region and a hidden storage region. A main storage region 1 and a hidden storage region 2 have memory cells MC00-MCn1 comprising nonvolatile memory transistors having a plurality of word lines WL0, WL1, WLn, and a plurality of bit lines BL0, BL1, and a floating gate, which is disposed at the intersecting location of the word and bit lines. The drain of a memory cell is connected to a bit line, the control gate is connected to a word line, and the source is connected to a source line SL. A source line SL is connected to a source line voltage controller 19. The constitution of portions outside thereof is the same as shown in FIG. 2, and the same reference numerals are assigned.

Figure 4:
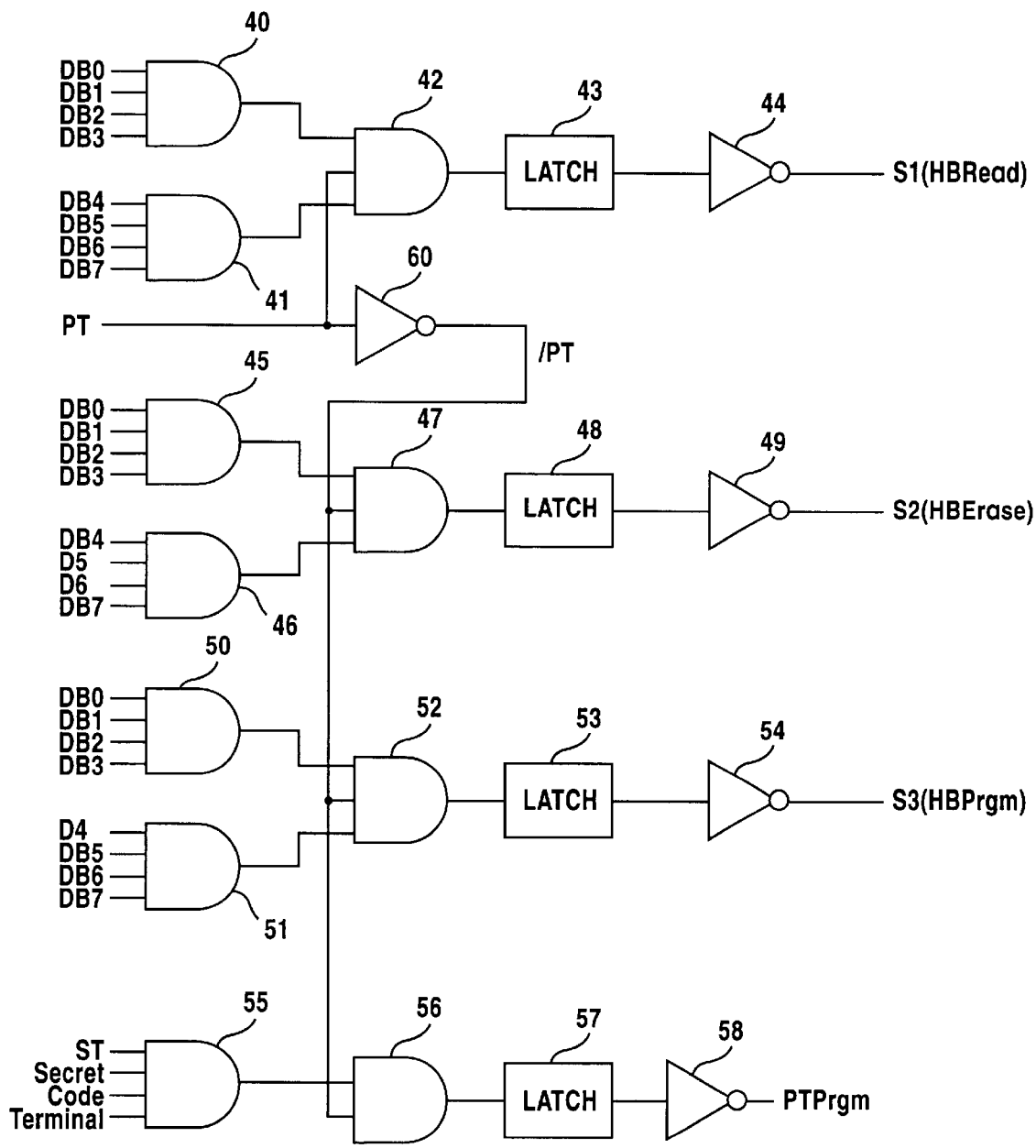
FIG. 4 is a diagram showing an example of a constitution of a command decoder.

FIG. 4 is a diagram showing an example of a constitution of a command decoder. In the example of FIG. 4, an internal read signal S1 for reading the hidden storage region 2, and an internal erase signal S2 for erasing the hidden storage region 2, and an internal programming signal S3 for writing (programming) the hidden storage region 2, and a protection programming signal PTPrgm for setting the write protect circuit 3 to a write protected state are generated respectively by AND gates.

As for an internal read signal S1, commands DB0–DB7 are decoded by AND gates 40, 41, 42, latched to a latch circuit 43, and the signal S1 is generated by way of an inverter 44. An internal erase signal S2, and internal programming signal S3 are also generated by decoding corresponding commands by the same circuit constitution. As for a protection programming signal PTPrgm, when a prescribed secret code ST is supplied, this secret code ST is decoded by AND gates 55, 56, latched to latch circuit 57, and the signal PTPrgm is generated by way of inverters 58.

When a write protect signal PT is supplied to the command decoder 22, and the write protect signal PT is not in a write protected state (L level), generation of an internal read signal S1 by AND gate 42 is prohibited. When in that state, a write protect signal PT is inverted by an inverter 60, and generation of an internal erase signal S2 and an internal programming signal S3 for the hidden storage region 2 is enabled by an H level of the inverted signal /PT thereof. Further, the generation of a protection programming signal PTPrgm to the write protect circuit 3 is enabled by the H level of the inverted signal /PT. The protection programming signal PTPrgm is generated in response to the supply of a secret code ST. Consequently, it is impossible for an ordinary user to perform programming for the write protected state thereof.

When a write protected state is written to the storage circuit inside a write protect circuit 3 by a protection programming signal PTPrgm, the write protect signal PT transitions to H level. As a result thereof, the command decoder 22 is prohibited from generating an internal erase signal S2, an internal programming signal S3 via AND gates 47, 52, and the rewriting of data to hidden storage region 2 is prohibited. Further, the command decoder 22 is prohibited from generating a protection programming signal PTPrgm via AND gate 56, and rewriting to the write protect circuit 3 subsequent thereto is prohibited. And, the generation of the internal read signal S1 is allowed.

Figure 5:
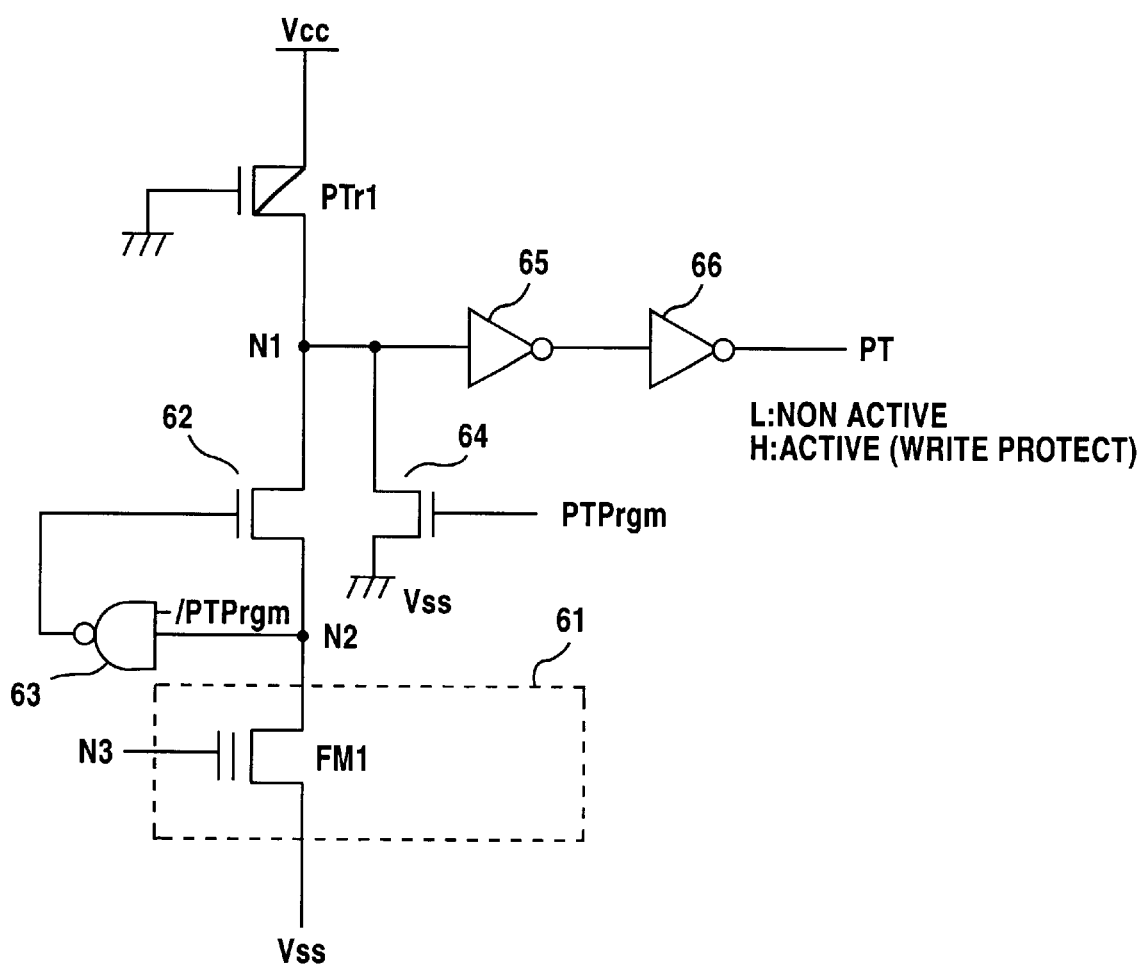
FIG. 5 is a circuit diagram showing an example of a write protect circuit.

FIG. 5 is a circuit diagram showing one example of a write protect circuit. Inside a write protect circuit 3 there is provided a storage circuit 61 for storing a write protected state. This write protect storage circuit 61 has a memory transistor FM1 having a floating gate, a control gate is connected to a terminal N3 to which is applied a prescribed voltage, and a source is connected to a ground potential Vss.

The write protect circuit 3 has a P-channel load transistor PTr1, which is biased to a ground, an N-channel transistor 62 for amplification, a NAND gate 63, inverters 65, 66, and an N-channel transistor 64 for protection programming. A protection programming signal PTPrgm is supplied to the gate of transistor 64, and an inverted signal /PT thereof and a node N2 are supplied to NAND gate 63.

In the initial state, the threshold voltage of transistor FM1 of the write protect storage circuit 61 is in a low state without electrons being injected into the floating gate. In the case thereof, when a read voltage is applied to terminal N3, transistor FM1 is made to conduct, node N2 becomes L level, the output of NAND gate 63 becomes H level, transistor 62 is made more conductive, and node N1 becomes L level. Consequently, a write protect signal PT is in an inactive state L level. That is, it does not constitute a write protected state.

In the state in which this write protect signal PT is L level, as explained hereinabove, the command decoder 22 is enabled for generating an internal erase signal S2, internal program signal S3, and protection programming signal PTPrgm in response to a command code from outside. However, generation of an internal read signal S1 is prohibited.

Next, when writing of a special code to the hidden storage region 2 is complete, a secret code ST is supplied from outside, and the command decoder 22 detects this secret code ST, and sets the protection programming signal PTPrgm to H level. As a result thereof, transistor 64 of the write protect circuit 3 is made conductive, and node N1 is pulled down to L level. Further, because the inverted signal /PT thereof becomes L level, the output of NAND gate 63 becomes H level, transistor 62 is made conductive, and node N2 is also made a ground potential Vss. Applying a high voltage to node N3 at this time causes electrons to be injected into the floating gate of transistor FM1, increasing the threshold voltage thereof. The writing of a special code and the conversion to a write protected state are performed by the above successive processes, making it possible for the written special data to be read out thereafter.

In this state, because transistor FM1 is not made conductive even if a read voltage is applied to node N3 of the write protect circuit 3, node N2 stays H level asis, and because signal /PTPrgm constitutes H level due to L level of signal PTPrgm, the output of NAND gate 63 becomes L level, transistor. 62 constitutes a nonconductive state, and transistor FM1 of the underside thereof is cut off from node N1. Consequently, node N1 is pulled up to H level by load transistor PTr1. Therefore, a write protect signal PT constitutes an H a level active state.

When this write protect signal PT becomes H level, as explained hereinabove, the command decoder 22 is prohibited from generating an internal erase signal S2, internal program signal S3, and protection programming signal PTprgm in response to the supply of the corresponding command code from outside. Consequently, rewriting of data to the hidden storage region 2 is prohibited, and rewriting of the release of a protected state to the write protect circuit 3 is also prohibited.

Second Aspect of the Embodiment

Figure 6:
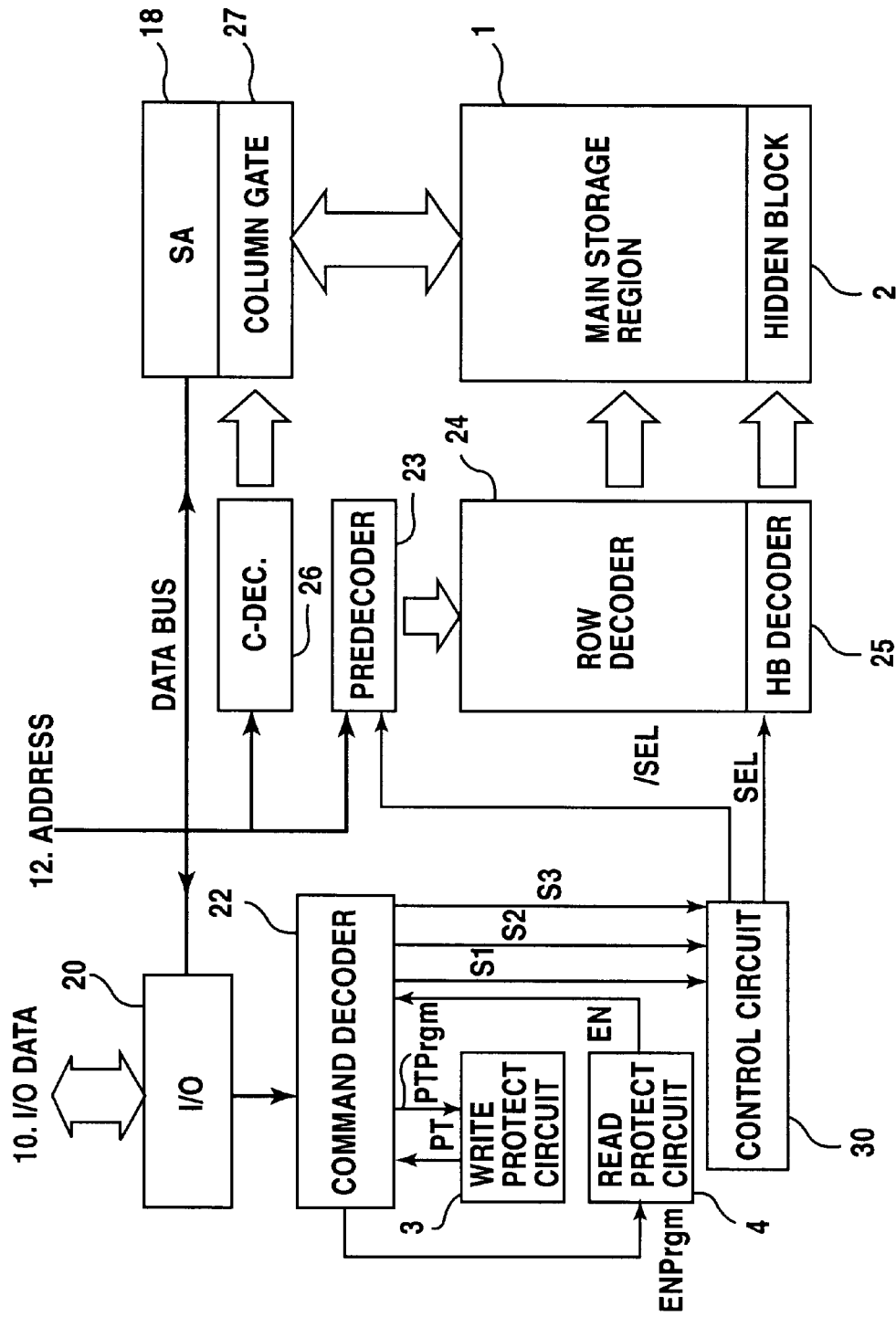
FIG. 6 is a block diagram of a flash memory in a second aspect of the embodiment.

FIG. 6 is a block diagram of a flash memory in a second aspect of the embodiment. In FIG. 6, the same reference numerals are assigned to the same portions as FIG. 2. In the second aspect of the embodiment, in addition to a write protect circuit 3 for the hidden storage region 2, there is also provided a read protect circuit 4 for prohibiting the reading of data from the hidden storage region 2. That is, a write protected state and a read protected state are not necessarily linked together.

The constitution of a read protect circuit 4 is basically the same as that of the write protect circuit 3 shown in FIG. 5. Initial state of a read protect circuit 4 is set to a read protected state. And the state of the read protect circuit 4 is converted to a read enable state by a read protection programming signal ENPrgm, which the command decoder 22 generates in response to a read protect command (secret command) from the outside. More specifically, a storage circuit inside the read protect circuit 4 is programmed the same as the case of the write protect circuit 3.

In line therewith, a read protect signal EN becomes an active level (H level), and the generation of an internal read signal S1 by the command decoder 22 is enabled, making it possible to read the data of the hidden storage region from outside. Further, when a read protect signal EN becomes H level, the generation of a read protection programming signal ENPrgm by the command decoder 22 is prohibited, and rewriting the storage circuit inside the read protect circuit is prohibited.

Figure 7:
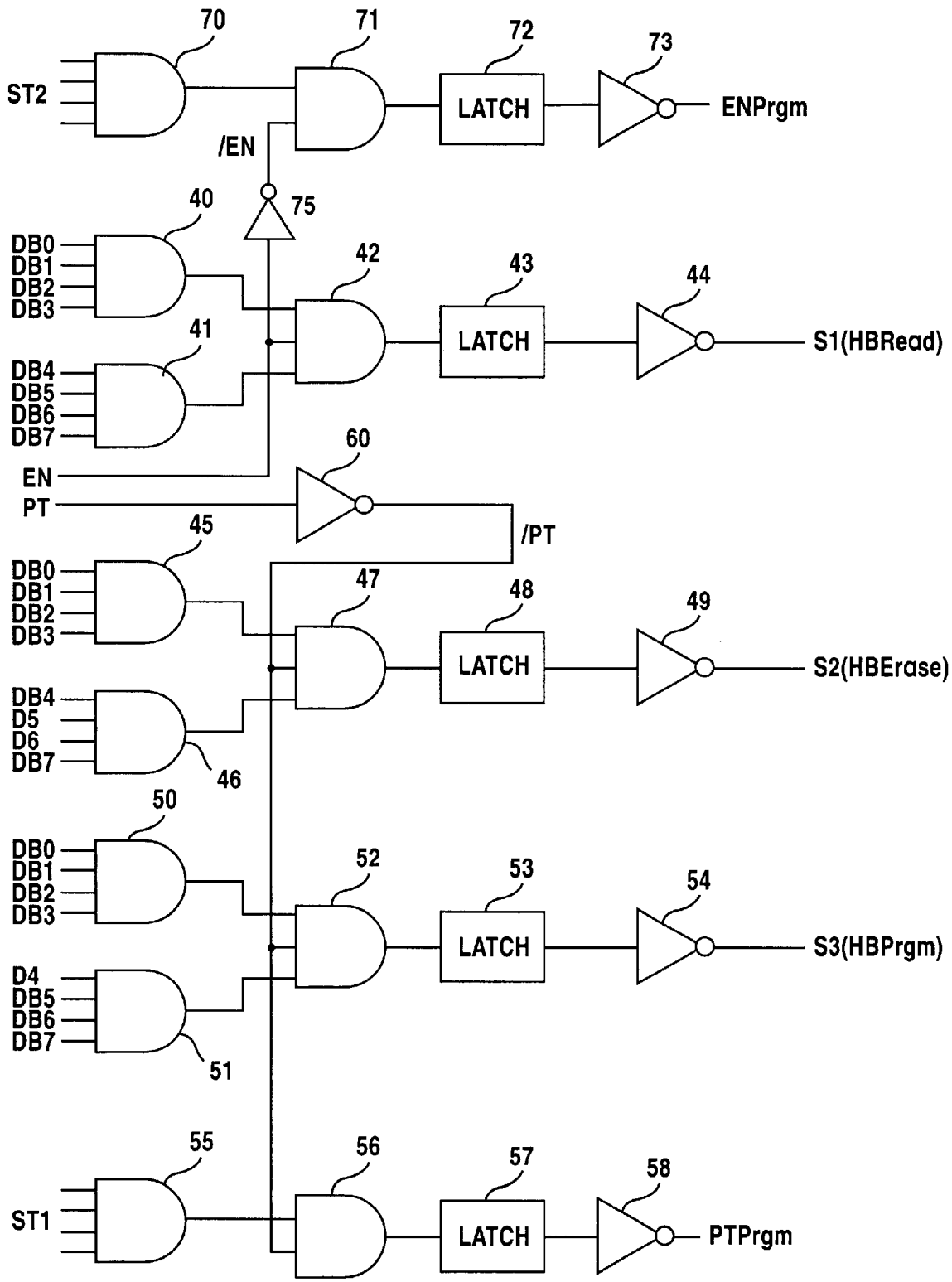
FIG. 7 is a diagram showing a constitution of a command decoder 22 in the second aspect of the embodiment.

FIG. 7 is a diagram showing the constitution of a command decoder 22 in the second aspect of the embodiment. In FIG. 7, the same reference numerals are assigned to portions corresponding to FIG. 4. The command decoder of FIG. 7, in addition to the constitution of FIG. 4, is provided with AND gates 70, 71 for decoding a secret code ST2, a latch circuit 72, and inverters 73, and generates a read protection programming signal ENPrgm.

As for the command decoder 22 of FIG. 7, the same as in FIG. 4, when a write protect signal PT is an initial state L level, the generation of an internal erase signal S2, and internal program signal 3 to the hidden storage region 2, and a protection programming signal PTPrgm to the write protect circuit 3 in response to an externally supplied command is enabled due to an H level of a signal /PT inverted by inverter 60. Conversely, when a write protect signal PT becomes an active state (H level), the generation of an internal erase signal S2, and internal program signal 3 to the hidden storage region 2, and a protection programming signal PTPrgm to the write protect circuit 3 in response to an externally supplied command is prohibited due to an L level of a signal /PT inverted by inverter 60.

Furthermore, for the command decoder 22 of FIG. 7, when the read protect signal EN is in the initial state, an inactive state (L level), the generation of an internal read signal S1 to the hidden storage region 2 by way of AND gate 42 is prohibited, and the generation of a read protection programming signal ENPrgm corresponding to a secret code ST2 is enabled due to an H level of a signal /EN inverted by inverter 75. Further, when the read protect signal EN is an active state (H level) after programming by the secret command, generation of an internal read signal S1 to the hidden storage region 2 is enabled, and the generation of a read protection programming signal ENPrgm corresponding to a secret code ST2 is prohibited by an L level of a signal /EN inverted by inverter 75.

As explained hereinabove, in a second aspect of the embodiment, a flash memory vendor sets the initial state of a read protect signal EN to an inactive state (L level) during the memory manufacturing process, thus prohibiting the generation of an internal read signal S1 to the hidden storage region 2, and making readout impossible. And then, when the flash memory is subjected to a testing process and passes such test to be a good device, an internal erase signal S2 and internal programming signal S3 are used to write a secret code to the hidden storage region 2 thereof, while at same time, the write protect circuit 3 is set to the write protected state, and the storage circuit inside the read protect circuit 4 is set to the read enable state by generating a read protection programming signal ENPrgm.

Consequently, for an illegally obtained flash memory, for which special data has not been written to the hidden storage region 2, because hidden storage region 2 data cannot be read out, the use of illegally copied data is prevented.

According to the present invention hereinabove, even if a nonvolatile semiconductor memory, which has not been programmed with a special code for preventing unauthorized copying, is obtained illegally, it is possible to prevent the unauthorized utilization of copied data, and in the end, it is possible to prevent unauthorized copying.

The foregoing scope of protection of the present invention is not limited to the aspects of the embodiment explained hereinabove, but rather extends to the inventions disclosed in the claims, and to equivalent devices thereto.

What is claimed is:

1. A nonvolatile semiconductor memory for electrically performing writing and reading of data, comprising:

a main storage region for storing ordinary data;

a hidden storage region for storing a special code for preventing unauthorized copying; and a write protect circuit for setting said hidden storage region in a write protected state, wherein said hidden storage region is in a read enabled state at the time of a write protected state, and is in a read prohibited state when not in the write protected state.

2. The nonvolatile semiconductor memory according to claim 1, further comprising:

a command decoder for decoding a write and a read command from outside, and for generating a respective internal write signal and an internal read signal for said hidden storage region, wherein said command decoder is prohibited from generating said internal read signal when said write protect circuit is not in the write protected state, and is enabled for generating said internal read signal at the time of the write protected state.

3. The nonvolatile semiconductor memory according to claim 2, wherein said command decoder is enabled for generating said internal write signal when said write protect circuit is not in the write protected state, and is prohibited from generating said internal write signal at the time of the write protected state.

4. A nonvolatile semiconductor memory for electrically performing writing and reading of data, comprising:

a main storage region for storing ordinary data; and a hidden storage region for storing a special code for preventing unauthorized copying, wherein said hidden storage region is in a read prohibited state when said special code has not been stored, and is in a read enabled state when said special code has been stored.

5. The nonvolatile semiconductor memory according to claim 4, further comprising:

a write protect circuit for setting said hidden storage region in a write protected state; and a read protect circuit for setting said hidden storage region in a read protected state, wherein reading of said hidden storage region is prohibited when said read protect circuit is in a read protected state, and reading of said hidden storage region is enabled when said read protect circuit is not in a read protected state.

6. The nonvolatile semiconductor memory according to claim 5, further comprising:

a command decoder for decoding a write and a read command from outside, and for generating an internal write signal and an internal read signal, respectively, for said hidden storage region, wherein said command decoder is prohibited from generating said internal read signal when said read protect circuit is in a read protected state, and is enabled for generating said internal read signal when said read protect circuit is not in a read protected state.

7. A nonvolatile semiconductor memory for electrically performing writing and reading of data, comprising:

a main storage region for storing ordinary data; and a hidden storage region for storing a special code for preventing unauthorized copying, wherein the hidden storage region is initially set to a read prohibited state, and is converted to a read enabled state in response to a secret command.

* * * * *

UNITED STATES PATENT AND TRADEMARK OFFICE
CERTIFICATE OF CORRECTION

PATENT NO. : 6,266,271 B1  Page 1 of 1
DATED : July 24, 2001
INVENTOR(S) : Shoichi Kawamura It is certified that error appears in the above-identified patent and that said Letters Patent is hereby corrected as shown below:

<u>Title page,</u>
Change the following Assignee information:
[73] Assignee: -- Fujitsu Limited -- instead of "Fujitisu Limited"

Signed and Sealed this

Twenty-third Day of April, 2002

*Attest:*

JAMES E. ROGAN
*Attesting Officer*   *Director of the United States Patent and Trademark Office*